US007855389B2

United States Patent
Ishikura et al.

(10) Patent No.: US 7,855,389 B2
(45) Date of Patent: Dec. 21, 2010

(54) SEMICONDUCTOR LIGHT-EMITTING DEVICE

(75) Inventors: Takuro Ishikura, Kashihara (JP); Tomihiro Ito, Niigata (JP)

(73) Assignee: Sharp Kabushiki Kaisha, Osaka (JP)

( * ) Notice: Subject to any disclaimer, the term of this patent is extended or adjusted under 35 U.S.C. 154(b) by 162 days.

(21) Appl. No.: 11/955,945

(22) Filed: Dec. 13, 2007

(65) Prior Publication Data

US 2008/0237614 A1 Oct. 2, 2008

(30) Foreign Application Priority Data

Mar. 29, 2007 (JP) ............... 2007-088233

(51) Int. Cl.
*H01L 33/00* (2010.01)
(52) U.S. Cl. .............. 257/79; 257/88; 257/89; 257/98; 257/E33.06; 257/E33.068; 257/33.065
(58) Field of Classification Search .......... 257/88, 257/89, 98, E33.06, E33.061, E33.065
See application file for complete search history.

(56) References Cited

U.S. PATENT DOCUMENTS

| 7,157,745 | B2* | 1/2007 | Blonder et al. ........ 257/98 |
| 7,221,003 | B2* | 5/2007 | Ueno et al. .......... 257/98 |
| 7,295,267 | B2* | 11/2007 | Ushitama et al. ...... 349/106 |
| 7,427,422 | B2* | 9/2008 | Wu et al. ............. 427/66 |
| 7,430,029 | B2* | 9/2008 | Katagami et al. ...... 349/114 |
| 7,436,000 | B2* | 10/2008 | Kim et al. ............ 257/98 |
| 7,455,423 | B2* | 11/2008 | Takenaka ............. 362/231 |
| 2005/0157157 | A1* | 7/2005 | Tsukamoto et al. ..... 347/213 |
| 2005/0194599 | A1* | 9/2005 | Tanaka ............... 257/79 |
| 2009/0122554 | A1* | 5/2009 | Ohashi et al. ........ 362/296.01 |
| 2009/0231833 | A1* | 9/2009 | Miki et al. ........... 362/84 |

FOREIGN PATENT DOCUMENTS

| JP | 7-15044 A | 1/1995 |
| JP | 2927279 | 5/1999 |
| JP | 2000-31531 A | 1/2000 |
| JP | 2004-274027 | 9/2004 |
| JP | 2006-229109 | 8/2006 |
| JP | 2006-310613 | 11/2006 |
| JP | 2007-35885 A | 2/2007 |

* cited by examiner

*Primary Examiner*—Matthew E Warren
*Assistant Examiner*—David Spalla
(74) *Attorney, Agent, or Firm*—Nixon & Vanderhye P.C.

(57) ABSTRACT

A semiconductor light-emitting device includes a first LED chip whose emitted light is wavelength-converted by a fluorescent substance layer formed by applying and curing a fluorescent substance material, and a second LED chip whose emitted light is not wavelength-converted by the fluorescent substance layer, wherein the first LED chip and the second LED chip are arranged on a substrate in such a way that a level of an emission layer of the second LED chip is higher than that of a top face of the first LED chip above the substrate.

4 Claims, 7 Drawing Sheets

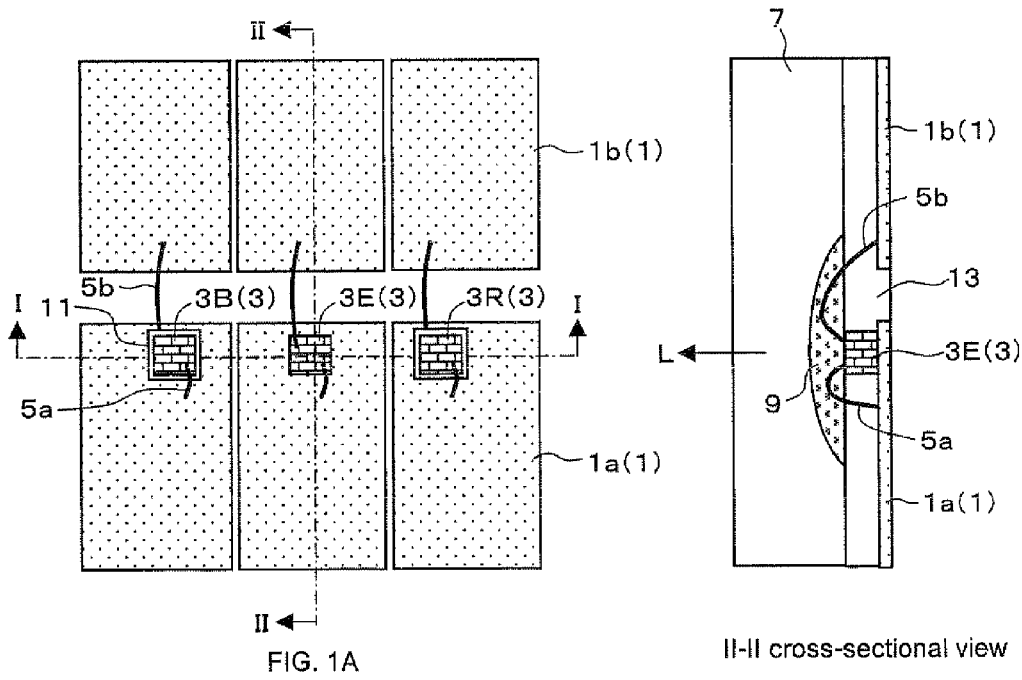
II-II cross-sectional view
FIG. 1C
FIG. 1A
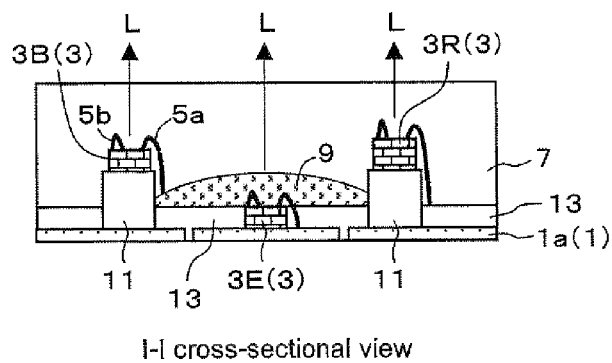
I-I cross-sectional view
FIG. 1B

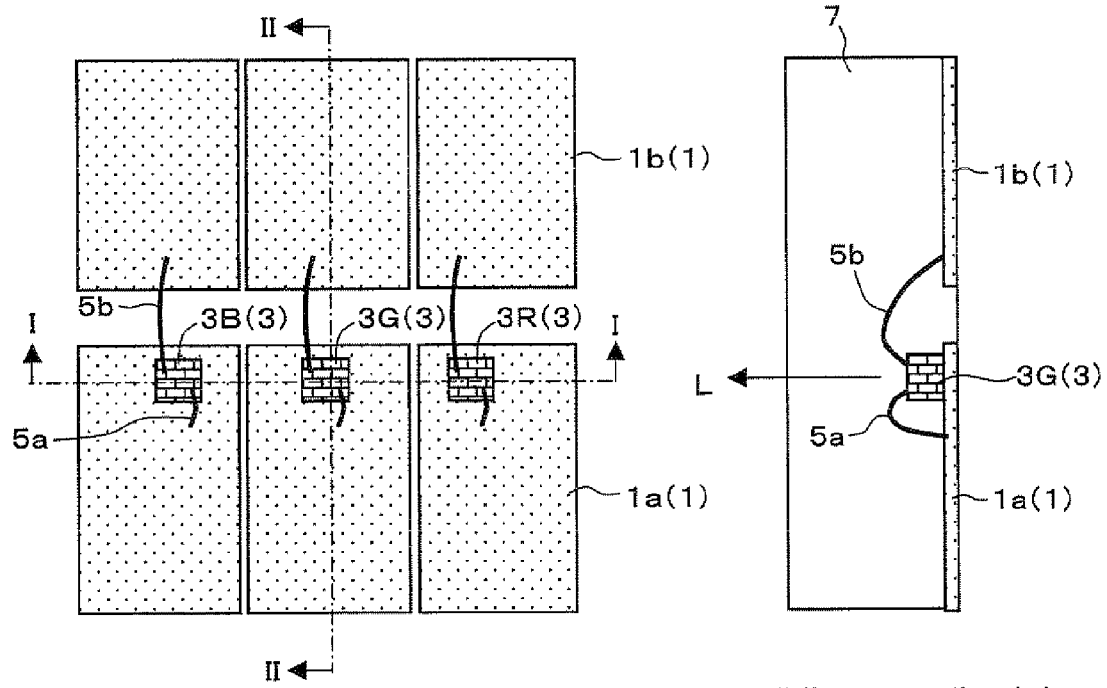
II-II cross-sectional view
FIG. 4C
FIG. 4A
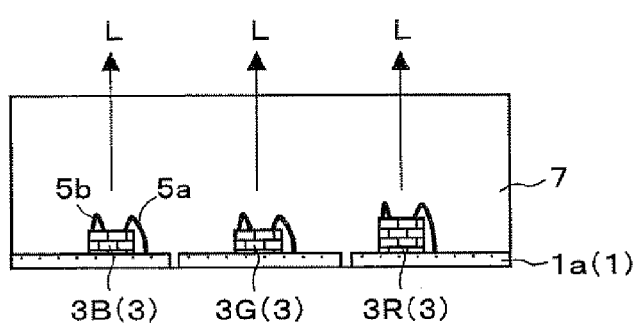
I-I cross-sectional view
FIG. 4B

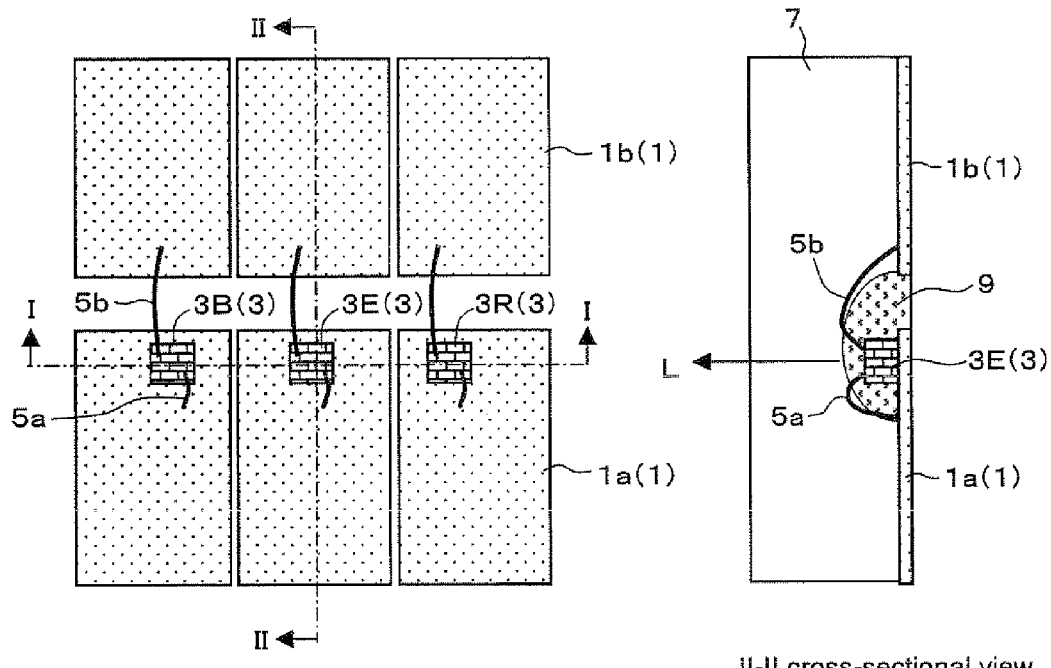
II-II cross-sectional view
FIG. 6C
FIG. 6A
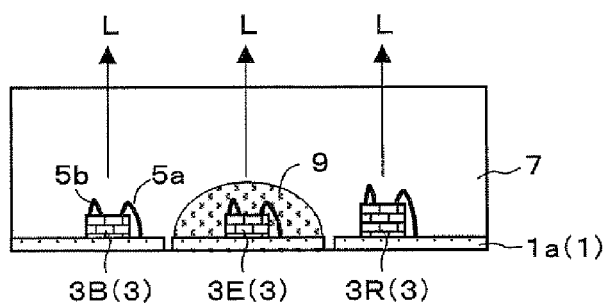
I-I cross-sectional view
FIG. 6B Green Fluorescent Substance Yellow Fluorescent Substance
+
Green Fluorescent Substance

SEMICONDUCTOR LIGHT-EMITTING DEVICE

CROSS-REFERENCE TO RELATED APPLICATION

This application is related to Japanese Patent Application No. 2007-88233 filed on Mar. 29, 2007, whose priority is claimed and the disclosure of which is incorporated by reference in its entirety.

BACKGROUND

1. Field of the Technology

The technology presented herein relates to a semiconductor light-emitting device (hereinafter, referred to an "LED").

2. Description of the Related Art

By using FIGS. 4A to 4C, conventional LEDs having a plurality of LED chips (for example, refer to Japanese Unexamined Patent Publication No. 2006-310613 and Japanese Unexamined Patent Publication No. 2004-274027) will be described. FIG. 4A is a plan view showing a structure of the conventional LED and FIGS. 4B and 4C are cross-sectional views along lines I-I and II-II, respectively, of FIG. 4A.

As shown in FIGS. 4A, 4B, and 4C, the conventional LED includes a blue LED chip 3B to emit blue light, a green LED chip 3G to emit green light and a red LED chip 3R to emit red light on a substrate 1. The substrate 1 has a first terminal 1a and a second terminal 1b for every LED chip 3. Each LED chip 3 is placed on the first terminal 1a. Each LED chip 3 has two electrodes, and a first conductive wire 5a electrically connects one electrode of the two electrodes and the first terminal 1a, and a second conductive wire 5b electrically connects the other electrode of the two electrodes and the second terminal 1b. The LED chips 3B, 3G and 3R are sealed with a transparent resin sealing layer 7. When a voltage is applied between the first terminal 1a and the second terminal 1b, the LED chips 3B, 3G and 3R emit blue, green and red lights L, respectively.

In such an LED, it is known that light of arbitrary color, for example white light, is obtained by mixing the blue, green and red lights.

However, a spectrum of the white light obtained by mixing the lights L emitted from the LED chips 3B, 3G and 3R has three peaks with narrow width as shown in FIG. 5, and such white light has a bad color rendering property.

There is known a technology in which as shown in FIG. 6, in order to improve a color rendering property, an exciting LED chip 3E to emit light (for example, blue light) for exciting a fluorescent substance is provided in place of the green LED chip 3G, and a fluorescent substance layer 9 is formed by applying a fluid material (hereinafter, referred to as a "fluorescent substance material") containing a fluorescent substance to the exciting LED chip 3E and curing the material. Spectra of the white light obtained in using a green fluorescent substance and in using both a yellow fluorescent substance and a green fluorescent substance are shown in FIGS. 7A and 7B, respectively. As shown in FIGS. 7A and 7B, it has been found that a width of a central peak becomes broad in either case and a color rendering property is improved by a combination of the exciting LED chip 3E and the fluorescent substance layer 9.

Since the fluorescent substance material has fluidity, when the fluorescent substance material is applied to the exciting LED chip 3, it may spread as shown in FIG. 8 and adhere to the LED chip 3 to which the fluorescent substance material is not applied. In this case, there may arise problems that emission intensity is reduced and control of color temperature becomes difficult.

The technology presented herein was made in view of the above circumstances, and it is a feature of an example embodiment presented herein to provide an LED which can prevent a fluorescent substance material from adhering to an LED chip whose emitted light is not wavelength-converted by a fluorescent substance layer.

SUMMARY

An LED of an example embodiment includes a first LED chip whose emitted light is wavelength-converted by a fluorescent substance layer formed by applying and curing a fluorescent substance material, and a second LED chip whose emitted light is not wavelength-converted by the fluorescent substance layer, wherein the first LED chip and the second LED chip are arranged on a substrate in such a way that a level of an emission layer of the second LED chip is higher than that of a top face of the first LED chip above the substrate.

In accordance with the example embodiment, since the first LED chip and the second LED chip are arranged in such a way that the level of the emission layer of the second LED chip is higher than that of the top face of the first LED chip above the substrate, the fluorescent substance material does not adhere to the second LED chip even when the fluorescent substance material spreads in applying the fluorescent substance material to the first LED chip. Therefore, the fluorescent substance material can be prevented from adhering to the second LED chip to which the fluorescent substance material is not applied.

BRIEF DESCRIPTION OF THE DRAWINGS

FIGS. 1A to 1C show structures of an LED of an embodiment, and FIG. 1A is a plan view of the structure, and FIGS. 1B and 1C are cross-sectional views along lines I-I and II-II, respectively, in FIG. 1A;

FIGS. 4A to 4C show the structure of the conventional LED, and FIG. 4A is a plan view of the structure, and FIGS. 4B and 4C are cross-sectional views along the lines I-I and II-II, respectively, in FIG. 4A;

FIGS. 6A to 6C show the structure of an LED in which a wavelength of light emitted from an exciting LED chip is converted by a fluorescent substance layer, and FIG. 6A is a plan view of the structure, and FIGS. 6B and 6C are cross-sectional views along the lines I-I and II-II, respectively, in FIG. 6A;

FIG. 7A shows an example of a spectrum in a case of using a green fluorescent substance, and FIG. 7B shows an example of the spectrum in the case of using both a green fluorescent substance and a yellow fluorescent substance.

DETAILED DESCRIPTION

An LED of an embodiment includes a first LED chip whose emitted light is wavelength-converted by a fluorescent substance layer formed by applying and curing a fluorescent substance material, and a second LED chip whose emitted light is not wavelength-converted by the fluorescent substance layer, wherein the first LED chip and the second LED chip are arranged on a substrate in such a way that a level of an emission layer of the second LED chip is higher than that of a top face of the first LED chip above the substrate.

In accordance with the embodiment, since the first LED chip and the second LED chip are arranged in such a way that the level of the emission layer of the second LED chip is higher than that of the top face of the first LED chip above the substrate, the fluorescent substance material does not adhere to the second LED chip even when the fluorescent substance material spreads in applying the fluorescent substance material to the first LED chip. Therefore, the fluorescent substance material can be prevented from adhering to the second LED chip to which the fluorescent substance material is not applied.

Hereinafter, various embodiments will be exemplified.

A transparent resin layer may be further provided on the substrate, and a part of or the whole of the first LED chip may be buried in the transparent resin layer, and the fluorescent substance layer may be provided on the transparent resin layer.

Figure 8:
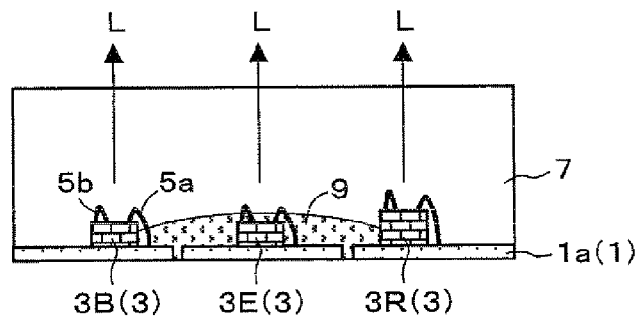
FIG. 8 is a cross-sectional view, corresponding to FIG. 6B, for illustrating problems in forming a fluorescent substance layer of the LED having the structure of FIGS. 6A to 6C.

When the fluorescent substance material spreads as shown in FIG. 8, an amount of the fluorescent substance material existing above the first LED chip decreases. Consequently, a thickness of the fluorescent substance layer 9 formed above the first LED chip decreases, and therefore there can arise a problem that a wavelength of light emitted upward from the first LED chip is not adequately converted. In the present embodiment, since a part of or the whole of the first LED chip is buried in the transparent resin layer, a surrounding area of the first LED chip is raised and most of the fluorescent substance material is placed at a position higher than that of the first LED chip. Therefore, in accordance with the present embodiment, a thickness of the fluorescent substance layer above the first LED chip becomes relatively large, and a wavelength of light emitted from the first LED chip is converted with more reliability.

The surface of the foregoing transparent resin layer and the top face of the first LED chip may be substantially in the same plane. In this case, the whole of the fluorescent substance material is placed at a position higher than that of the first LED chip, and a thickness of the fluorescent substance layer above the first LED chip tends to become large. When a thickness of the transparent resin layer is unnecessarily too large, there can arise a problem that the second LED chip has to be placed at a very high position, but in the present embodiment, such a problem does not arise.

The second LED chip may be placed on the substrate with a bank-raising portion interposed between the second LED chip and the substrate. When the bank-raising portion is used, it is easy to make the level of the emission layer of the second LED chip higher than that of the top face of the first LED chip.

In the second LED chip, the height of a portion of the second LED chip below the emission layer of the second LED chip may be higher than that of the first LED chip. In this case, it is possible to make the level of the emission layer of the second LED chip higher than that of the top face of the first LED chip without using the bank-raising portion.

The number of the second LED chips may be multiple and the foregoing bank-raising portion may be provided for each second LED chip. When a plurality of the second LED chips are placed on a single bank-raising portion, a size of the bank-raising portion may become large, but the size of the bank-raising portion can be reduced to the required minimum in accordance with the present embodiment.

In accordance with the example embodiment, there is provided a method of producing an LED, comprising the steps of placing the first LED chip and the second LED chip on a substrate, applying the fluorescent substance material to the first LED chip and curing it to form a fluorescent substance layer, wherein the first LED chip and the second LED chip are arranged in such a way that the level of the emission layer of the second LED chip is higher than that of the top face of the first LED chip above the substrate.

In accordance with this method, since the first LED chip and the second LED chip are arranged in such a way that the level of the emission layer of the second LED chip is higher than that of the top face of the first LED chip above the substrate, the fluorescent substance material does not adhere to the second LED chip even when the fluorescent substance material spreads in applying the fluorescent substance material to the first LED chip. Therefore, the fluorescent substance material is prevented from adhering to the second LED chip.

The method of producing an LED of the example embodiment presented herein may further comprise the step of forming a transparent resin layer on the foregoing substrate so that a part of or the whole of the first LED chip can be buried in the transparent resin layer before applying the foregoing material. As described above, a thickness of the fluorescent substance layer above the first LED chip becomes large, and a wavelength of light emitted from the first LED chip is converted with more reliability.

The foregoing transparent resin layer may be formed in such a way that the surface of the transparent resin layer and the top face of the first LED chip are substantially in the same plane. In this case, the whole of the fluorescent substance material is placed at a position higher than that of the first LED chip, and a thickness of the fluorescent substance layer above the first LED chip tends to become large.

The placement of the second LED chip may be performed by forming a bank-raising portion on the foregoing substrate and placing the second LED chip on the foregoing bank-raising portion. In this case, it is easy to make the level of the emission layer of the second LED chip higher than that of the top face of the first LED chip.

In the second LED chip, the height of a portion of the second LED chip below the emission layer of the second LED chip may be higher than that of the first LED chip. In this case, it is possible to make the level of the emission layer of the second LED chip higher than that of the top face of the first LED chip without using the bank-raising portion.

The number of the second LED chips may be multiple and the foregoing bank-raising portion may be provided for each second LED chip. When a plurality of the second LED chips are rested on a single bank-raising portion, a size of the bank-raising portion may become large, but the size of the bank-raising portion can be reduced to the required minimum in accordance with the present embodiment.

Various embodiments shown above can be combined with one another.

Hereinafter, an embodiment will be described by way of drawings. The contents shown in drawings and descriptions below are just exemplifications and the scope of the example embodiment is not limited to the contents shown in drawings and descriptions below. In the following embodiment, the case where a first LED chip is an exciting LED chip 3E and second LED chips are a blue LED chip 3B and a red LED chip 3R will be described as an example. The following description holds true for the case where the number of the second LED chips is one or three or more, or the case where the second LED chip is an LED chip to emit light of a color (wavelength) other than blue or red.

1. Structure of LED

By use of FIGS. 1A to 1C, a structure of the LED of an embodiment of the present invention will be described. FIG. 1A is a plan view showing a structure of the LED of the present embodiment, and FIGS. 1B and 1C are cross-sectional views along the lines I-I and II-II, respectively, in FIG. 1A.

As shown in FIGS. 1A, 1B, and 1C, the LED of the present embodiment includes the blue LED chip 3B to emit blue light L, the exciting LED chip 3E to emit light L for exciting the fluorescent substance, and the red LED chip 3R to emit red light L on a substrate 1. The blue LED chip 3B and the red LED chip 3R are placed on the substrate 1 with each bank-raising portion 11, provided for each LED chip, interposed between each LED chip and the substrate 1. The exciting LED chip 3E, the blue LED chip 3B, and the red LED chip 3R are arranged in such a way that levels of the emission layers of the blue LED chip 3B and the red LED chip 3R are higher than that of a top face of the exciting LED chip 3E above the substrate 1.

A transparent resin layer 13 is provided on the substrate 1 and the exciting LED chip 3E is buried in the transparent resin layer 13. The surface of the transparent resin layer 13 and the top face of the exciting LED chip 3E are substantially in the same plane.

A fluorescent substance layer 9 is provided on the transparent resin layer 13 and immediately above and in a vicinity of the exciting LED chip 3E. Therefore, a wavelength of the emitted light L from the exciting LED chip 3E is converted by the fluorescent substance layer 9. The fluorescent substance layer 9 is formed by applying a fluorescent substance material to the exciting LED chip 3E and curing it. The fluorescent substance layer 9 is not placed above the blue LED chip 3B and the red LED chip 3R, and a wavelength of the light L emitted from the blue LED chip 3B and the red LED chip 3R is not converted by the fluorescent substance layer 9.

The substrate 1 has a first terminal 1a and a second terminal 1b for every LED chip 3. Each LED chip 3 is placed on the corresponding first terminal 1a. Further, each LED chip 3 has two electrodes, and a first conductive wire (example: gold wire) 5a electrically connects one electrode of the two electrodes and the first terminal 1a, and a second conductive wire (example: gold wire) 5b electrically connects the other electrode of the two electrodes and the second terminal 1b. The LED chips 3B, 3G and 3K are sealed with a transparent resin sealing layer 7.

Hereinafter, each constituent will be described in detail.

1-1. Substrate

A constitution of the substrate 1 is not particularly limited. In one example, the substrate 1 is a lead frame, and the first terminal 1a and the second terminal 1b are lead terminals, but the constitution of the substrate 1 and the terminals 1a and 1b are not limited to this. The substrate 1 and the terminals 1a and 1b can comprise, for example, an insulating substrate (example: glass-epoxy substrate) and interconnection patterns formed thereon.

1-2. LED Chip

The constitutions such as a material, a shape, a dimension and a wavelength of each LED chip 3 are not particularly limited. An example in which two electrodes are present on one side of the LED chip 3 is shown in FIGS. 1A to 1C, but one electrode may be provided on each side of the LED chip 3. In this case, since the LED chip 3 can be electrically connected to the first terminal 1a at its contact surface with the first terminal 1a, the first conductive wire 5a can be omitted. When two electrodes are formed on one side of the LED chip 3, the first conductive wire 5a and the second conductive wire 5b can be omitted by arranging the LED chip 3 on the substrate 1 in such a way that these two electrodes are opposed to the substrate 1. In addition, in this case, the terminal or the interconnection pattern which is connected to the electrode is configured in such a way that two electrodes of the LED chip 3 do not make a short circuit.

In one example, the blue LED chip 3B and the exciting LED chip 3E are InGaN based (a semiconductor of a group III-V compound in which a group V element is nitrogen) LED chips in which InGaN layers are formed by epitaxial growth on an insulating sapphire substrate, and the red LED chip 3R is a InGaAlP—GaAs based LED. Wavelengths of lights emitted from the blue LED chip 3B and the exciting LED chip 3E are the same in this example, but they may be different in another example. The light emitted from the exciting LED chip 3E may be any kind of light (for example, ultraviolet light) as long as it can excite a fluorescent substance contained in the fluorescent substance layer 9.

1-3. Bank-Raising Portion

The constitutions such as a material, a shape and a dimension of the bank-raising portion 11 are not particularly limited. The bank-raising portion 11 is preferably made of a material having high thermal conductivity, for example metal such as aluminum, from the viewpoint of dissipating heat generated in the LED chip 3 to the substrate 1. A method of forming the bank-raising portion 11 is not particularly limited. The bank-raising portion 11 may be formed integrally with the substrate 1 by casting, or may be formed by preparing a block-shaped member and bonding this member to the substrate 1.

A planar shape of the bank-raising portion 11 is similar to, for example, that of the LED chip 3, and the dimension of the bank-raising portion 1 is slightly larger than that of, for example, the LED chip 3. In this case, the size of the bank-raising portion 11 can be reduced to the required minimum. The height of the bank-raising portion 11 is not particularly limited as long as it is a level by which the fluorescent substance material can be prevented from adhering to the LED chip 3 in forming the fluorescent substance layer 9. In the present embodiment, the bank-raising portion 11 is provided one to each LED chip 3. When a plurality of the LED chips 3 are placed on a single bank-raising portion 11, a size of the bank-raising portion 11 may become large, but the size of the bank-raising portion 11 become relatively small since the bank-raising portion 11 is provided for every LED chip 3.

1-4. Transparent Resin Layer

The constitutions such as a material, a thickness and a formation method of the transparent resin layer 13 are not particularly limited. In the present embodiment, a thickness of the transparent resin layer 13 is nearly equal to a height of the exciting LED chip 3E (that is, the surface of the transparent resin layer 13 and the top face of the exciting LED chip 3E are substantially in the same plane), but the thickness of the transparent resin layer 13 may be thinner or thicker than this. However, it is preferable that the level of the surface of the transparent resin layer 13 is lower than that of the top face of the bank-raising portion 11 (that is, a length in a direction of the thickness of the transparent resin layer 13 is made shorter than that in a direction of the height of the bank-raising portion 11). The reason for this is that if the level of the top face of the transparent resin layer 13 is higher than that of the top face of the bank-raising portion 11, the fluorescent substance material is likely to adhere to the LED chip 3 other than the exciting LED chip 3E.

Figure 2A:
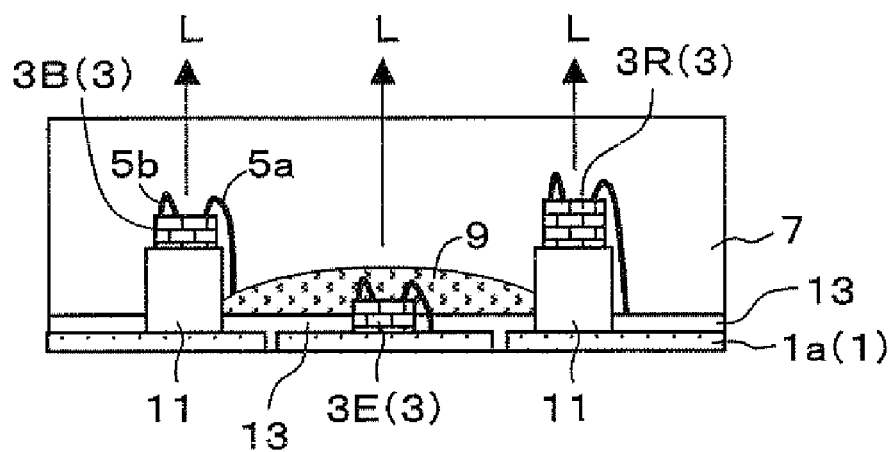
FIGS. 2A and 2B are cross-sectional views corresponding to FIG. 1B, each showing a structure of an LED of another embodiment.

FIG. 2A shows the case where a thickness of the transparent resin layer 13 is smaller than that of the exciting LED chip 3E. The exciting LED chip 3E is partially buried in the transparent resin layer 13. In this case, since a surrounding area of the exciting LED chip 3E is also raised and most of the fluorescent substance material is placed at a position higher than that of the exciting LED chip 3E, a thickness of the fluorescent substance layer 9 above the exciting LED chip 3E becomes larger by providing the transparent resin layer 13. Thereby, a wavelength of light L emitted upward from the exciting LED chip 3E is converted with more reliability.

Figure 2B:
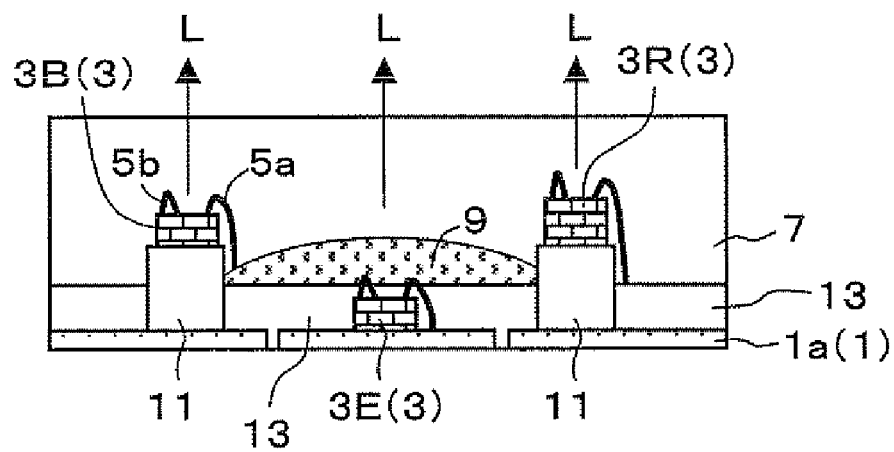

FIG. 2B shows the case where a thickness of the transparent resin layer 13 is slightly larger than that of the exciting LED chip 3E. In this case, the exciting LED chip 3E is fully buried in the transparent resin layer 13. In such a case, a thickness of the fluorescent substance layer 9 above the exciting LED chip 3E also becomes larger by providing the transparent resin layer 13.

The transparent resin layer 13 can be formed by applying and curing (example: thermal curing or photocuring) a fluid transparent resin. Examples of the transparent resin include a silicone resin and an epoxy resin. In the transparent resin layer 13, it is preferable that the surface of the cured resin layer is flat. Therefore, it is preferable that a material having lower viscosity than that of a material of the transparent resin sealing layer 7 is used for the material of the transparent resin layer 13.

1-5. Fluorescent Substance Layer

The constitutions such as a material, a thickness and a formation method of the fluorescent substance layer 9 are not particularly limited as long as the fluorescent substance layer 9 is formed by applying and curing the fluorescent substance material. The position where the fluorescent substance layer 9 is placed is not particularly limited as long as it is a position where a wavelength of light L emitted from the exciting LED chip 3E can be converted. For example, the fluorescent substance layer 9 can be formed by applying the fluorescent substance material to the exciting LED chip 3E and curing (example: thermal curing or photocuring) the material. The fluorescent substance material may be applied to the surface of the exciting LED chip 3E, or it may be applied to the surface of the transparent resin layer 13 when the exciting LED chip 3E is covered with the transparent resin layer 13 as shown in FIG. 2B.

The fluorescent substance material comprises, for example, substances formed by dispersing the fluorescent substance in a fluid resin. Examples of species of the resin include a silicone resin and an epoxy resin, but when excited light is blue light or ultraviolet light having a shorter wavelength, the silicone resin is preferable because of it is unlikely to deteriorate. Species of the fluorescent substance is not particularly limited. Examples of the fluorescent substance include cerium-activated YAG (Ce:YAG (for example, refer to Japanese Patent No. 2927279)) and an europium-activated silicate based fluorescent substance (Eu:BOSE (barium strontium o-silicate), Eu:SOSE (strontium barium o-silicate) etc.). These fluorescent substances are excited with blue light and have a broad emission spectrum having a peak around yellow.

1-6. Transparent Resin Sealing Layer

The constitutions such as a material, a thickness and a formation method of the transparent resin sealing layer 7 are not particularly limited. The transparent resin sealing layer 7 can be formed by applying and curing (example: thermal curing or photocuring) a fluid transparent resin. Examples of the transparent resin include a silicone resin and an epoxy resin. A material of the transparent resin sealing layer 7 may be the same as or different from that of the transparent resin layer 13. When the material of the transparent resin sealing layer 7 is different from that of the transparent resin layer 13, it is preferable to select the material not to produce an interface between layers 7 and 13.

1-7. Reflector

The LED of the present embodiment may include a reflector to reflect light from each LED chip 3. As the reflector, a reflector shown in Japanese Unexamined Patent Publication No. 2006-310613 and Japanese Unexamined Patent Publication No. 2004-274027, for example, can be employed. The reflector surrounds all LED chips 3 and has a tapered reflecting surface which is leaned outward as the position in the surface gets further from the substrate 1.

2. Method of Producing LED

Next, by use of FIGS. 3A to 3E, the above-mentioned method of producing an LED will be described. The method of producing an LED described below is just an exemplification and the above-mentioned LED can also be produced by another method.

2-1. Steps of Arranging LED Chips and Forming Bank-Raising Portion

First, the exciting LED chip 3E is placed on the substrate 1 and next, the bank-raising portions 11 are formed on the substrate 1, and the blue LED chip 3B and the red LED chip 3R are placed on these bank-raising portions 11, respectively to obtain a structure shown in FIG. 1A. As shown in FIG. 1A, the blue LED chip 3B and the red LED chip 3R are placed on the substrate 1 with each bank-raising portion 11 interposed between each LED chip and the substrate 1, and levels of the emission layers of the blue LED chip 3B and the red LED chip 3R are higher than that of a top face of the exciting LED chip 3E above the substrate 1.

The placement of the exciting LED chip 3E can be performed, for example, by bonding the exciting LED chip 3E to the substrate 1 by using an Ag paste, and curing the Ag paste by using an oven. The formation of the bank-raising portion 11 can be performed, for example, by bonding a bank-raising block made of aluminum or the like to the substrate 1 by using an Ag paste, and curing the Ag paste by using an oven. The placement of the blue LED chip 3B and the red LED chip 3R can be performed, for example, by bonding the blue LED chip 3B and the red LED chip 3R to the bank-raising portion 11 by using an Ag paste, and curing the Ag paste by use of an oven. Each curing of Ag paste may be performed separately, or may be performed simultaneously after completing bonding of all LED chips 3 and the bank-raising portion 11.

2-2. Step of Interconnection

Figure 3A:
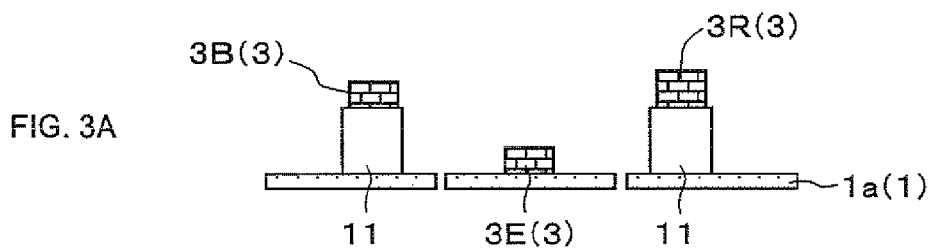
FIGS. 3A to 3E are cross-sectional views showing a production process of the LED of an embodiment.
Figure 3B:
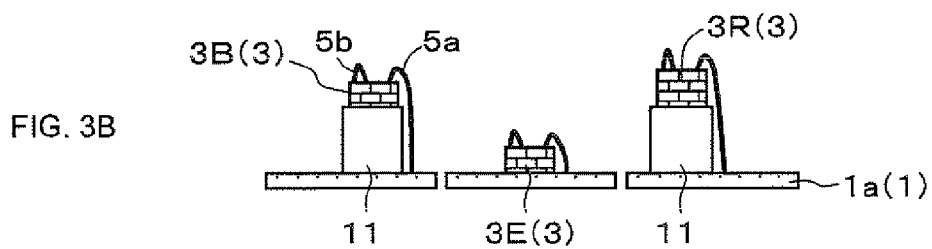

Next, one electrode of each LED chip 3 and the first terminal 1a of the substrate 1 is connected with the first conductive wire 5a, and the other electrode of each LED chip 3 and the second terminal 1b of the substrate 1 is connected with the second conductive wire 5b, to obtain a structure shown in FIG. 3B.

2-3. Step of Forming Transparent Resin Layer

Figure 3C:
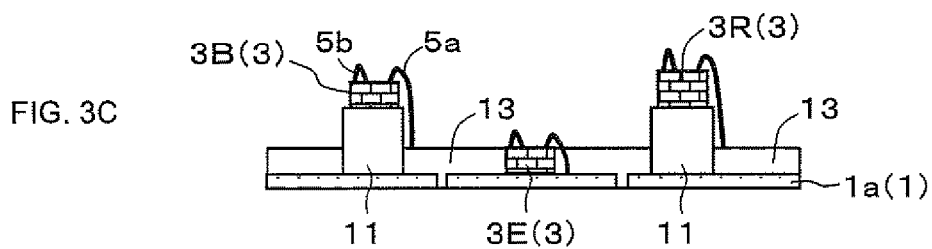

Next, the transparent resin layer 13 is formed on a substrate 1 so that a part of or the whole of the exciting LED chip 3E can be buried in the transparent resin layer to obtain a structure shown in FIG. 3C. The transparent resin layer 13 is formed in such a way that the surface of the transparent resin layer and the top face of the exciting LED chip 3E are substantially in the same plane.

2-4. Step of Forming Fluorescent Substance Layer

Figure 3D:
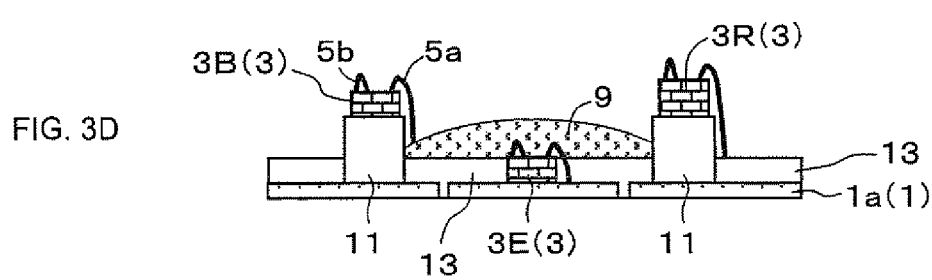

Next, a fluorescent substance layer 9 is formed by applying a fluorescent substance material to the exciting LED chip 3E and curing it to obtain a structure shown in FIG. 3D.

2-5. Step of Forming Transparent Resin Sealing Layer

Figure 3E:
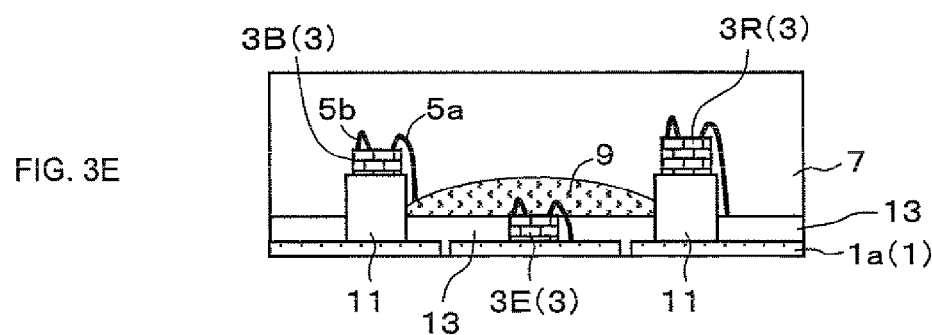
Figure 5:
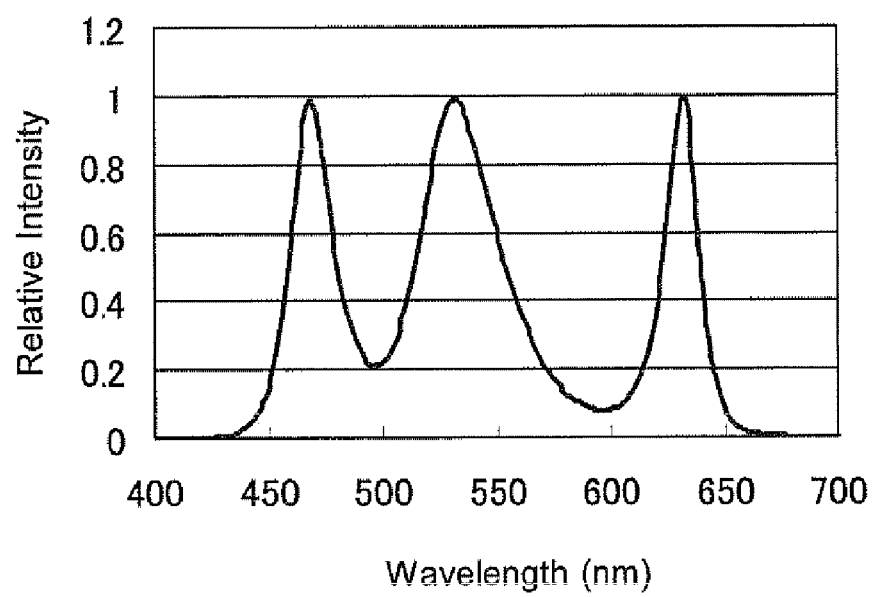
FIG. 5 shows an example of spectra of light emitted from the LED of FIGS. 4A to 4C.
Figure 7A:
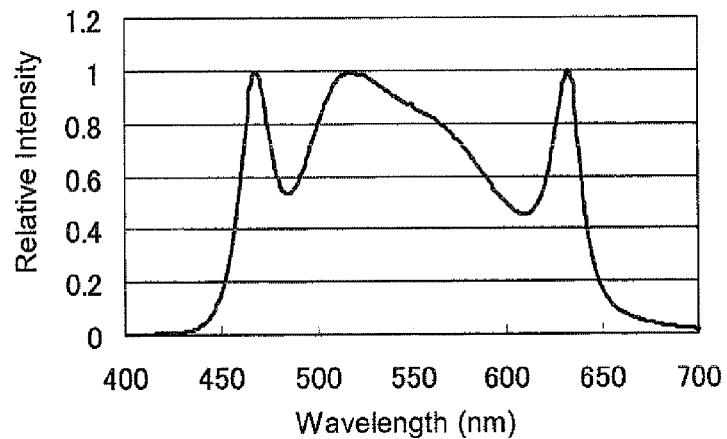
FIGS. 7A and 7B, respectively, show examples of the spectra of the light emitted from the LED of FIGS. 6A to 6C.
Figure 7B:
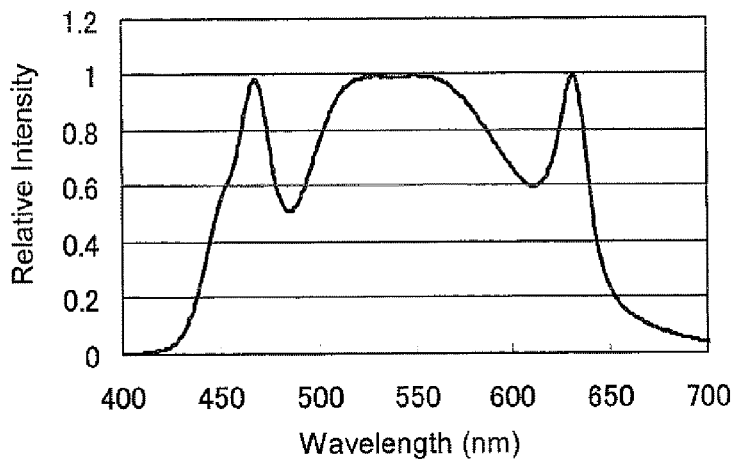

Next, a transparent resin sealing layer 7 is formed in a thickness in which each LED chip 3 and the conductive wires 5a and 5b are buried to obtain a structure shown in FIG. 3E, and thereby, a production process of the LED of the present embodiment is completed.

Various characteristics shown in the above embodiments can be combined with one another. When a plurality of characteristics are contained in an embodiment, one or a plurality of characteristics thereof may be appropriately selected from these characteristics, and may be adopted singly or in combination.

What is claimed is:

1. A semiconductor light-emitting device comprising a first LED chip whose emitted light is wavelength-converted by a fluorescent substance layer formed by applying and curing a fluid material containing a fluorescent substance, and a second LED chip whose emitted light is not wavelength-converted by the fluorescent substance layer, wherein the first LED chip and the second LED chip are arranged on a substrate in such a way that a level of an emission layer of the second LED chip is higher than that of a top face of the first LED chip above the substrate, further comprising a transparent resin layer on the substrate, wherein a part of or the whole of the first LED chip is buried in the transparent resin layer and the fluorescent substrate layer is provided on the transparent resin layer.

2. The device of claim 1, wherein a surface of the transparent resin layer and the top face of the first LED chip are substantially in the same plane.

3. The device of claim 1, wherein the second LED chip is placed on the substrate with a bank-raising portion interposed between the second LED chip and the substrate.

4. The device of claim 3, wherein the second LED chip is provided plurally and the bank-raising portion is provided for each of the second LED chips.

* * * * *